US008680950B2

(12) United States Patent
Taniguchi

(10) Patent No.: US 8,680,950 B2
(45) Date of Patent: *Mar. 25, 2014

(54) MULTILAYER BANDPASS FILTER

(75) Inventor: Tetsuo Taniguchi, Yasu (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 489 days.

This patent is subject to a terminal disclaimer.

(21) Appl. No.: 12/880,244

(22) Filed: Sep. 13, 2010

(65) Prior Publication Data

US 2011/0074526 A1    Mar. 31, 2011

(30) Foreign Application Priority Data

Sep. 28, 2009    (JP) ................................. 2009-223417

(51) Int. Cl.
*H03H 7/01*    (2006.01)
(52) U.S. Cl.
USPC ......................................................... 333/185
(58) Field of Classification Search
USPC ........................... 333/175, 177, 185, 202–206
See application file for complete search history.

(56) References Cited

U.S. PATENT DOCUMENTS

| 6,583,687 B2 * | 6/2003 | Nosaka ........................... 333/175 |
| 7,312,676 B2 * | 12/2007 | Kundu ........................... 333/204 |
| 8,212,633 B2 * | 7/2012 | Taniguchi ..................... 333/175 |
| 2007/0241839 A1 * | 10/2007 | Taniguchi ..................... 333/185 |
| 2010/0073108 A1 | 3/2010 | Yamasita et al. |
| 2010/0171568 A1 | 7/2010 | Taniguchi |

FOREIGN PATENT DOCUMENTS

| EP | 1 657 826 A2 | 5/2006 |
| EP | 1 742 354 A2 | 1/2007 |
| JP | 2003-87005 A | 3/2003 |
| JP | 2007-13962 A | 1/2007 |
| WO | 2006/009274 A1 | 1/2006 |
| WO | 2008/066198 A1 | 6/2008 |
| WO | 2009/041294 A1 | 4/2009 |

OTHER PUBLICATIONS

A. Sutono, J. Lasker, W.R. Smith, "Design of Miniature Multilayer On-Package Integrated Image-Reject Filters", IEEE Trans. MTT, vil. 51, No. 1, Jan. 2003, pp. 156-162.*
C.W. Tang, Y.C. Lin, and C. Y. Chang, "Realization of Transmission Zeros in Combline Filters Using an Auxiliary Inductively Coupled Ground Plane", IEEE Trans on MTT, vol. 51, No. 10, Oct. 2003, pp. 2112-2118.*

(Continued)

*Primary Examiner* — Benny Lee
*Assistant Examiner* — Rakesh Patel
(74) *Attorney, Agent, or Firm* — Keating & Bennett, LLP

(57) ABSTRACT

In a multilayer bandpass filter, a first capacitor is defined between a first capacitor electrode and a ground electrode. A second capacitor is defined between a second capacitor electrode and the ground electrode. A first inductor is defined by first and second via electrodes and a first inductor electrode. A second inductor is defined by third and fourth via electrodes and a second inductor electrode. Two LC parallel resonators, one of which includes the first inductor and the first capacitor and the other one of which includes the second inductor and the second capacitor, are provided. The second via electrode included in one of the LC parallel resonators and the fourth via electrode included in the other one of the LC parallel resonators are electrically connected to each other by a via coupling electrode.

4 Claims, 10 Drawing Sheets

(56) References Cited

OTHER PUBLICATIONS

J. S. Lim and D. C. Park, "A Modified Chebychev Bandpass Filter with Attenuation Poles in the Stopband", IEEE Trans. on Microwave Theory and Techniques, vol. 45, No. 6, Jun. 1997, pp. 898-904.*
Official Communication issued in corresponding European Patent Application No. 10179624.1, mailed on Jun. 7, 2011.
Chang et al., "Bandpass Filter of Serial Configuration With Two Finite Transmission Zeros Using LTCC Technology", IEEE Transactions on Microwave Theory and Techniques, vol. 53, No. 7, pp. 2383-2388, Jul. 2005.
English translation of Official Communication issued in corresponding European Patent Application No. 10 179 624.1, mailed on Dec. 16, 2013.

* cited by examiner

MULTILAYER BANDPASS FILTER

BACKGROUND OF THE INVENTION

1. Field of the Invention

The present invention relates to a multilayer bandpass filter in which a plurality of dielectric layers and a plurality of electrode layers are laminated.

2. Description of the Related Art

Recently, high-frequency bandpass filters suitable for miniaturization and cost reduction have been manufactured by providing a plurality of LC parallel resonators in a stack of dielectric layers and electrode layers.

Japanese Unexamined Patent Application Publication No. 2007-13962 discloses such a multilayer bandpass filter.

The configuration of a multilayer bandpass filter 200 disclosed in Japanese Unexamined Patent Application Publication No. 2007-13962 will be described with reference to FIGS. 9 and 10.

FIG. 9 is an exploded perspective view of the multilayer bandpass filter 200. FIG. 10 is an equivalent circuit diagram of the multilayer bandpass filter 200. As illustrated in FIG. 9, the multilayer bandpass filter 200 includes a stack of a dummy layer 210, a dielectric layer 211 on which a floating ground electrode 220 is formed, a dielectric layer 212 on which two half-wavelength resonators 222 and 224 are formed, a dielectric layer 213 on which a capacitor electrode 228 is formed, a dielectric layer 214 on which capacitor electrodes 230 and 232 are formed, a dielectric layer 215 on which capacitor electrodes 234 and 236 are formed, and a dielectric layer 216 on which input/output electrodes 238 and 240 and a ground electrode 242 are formed.

The substantially reverse L-shaped half-wavelength resonator 222 and the substantially L-shaped half-wavelength resonator 224 are symmetrically disposed at the center of the dielectric layer 212 so that they are spaced apart from each other by a predetermined distance. As a result, the half-wavelength resonators 222 and 224 are coupled to each other by magnetic field coupling. End portions at the long sides of these resonators are coupled to each other by a conductor electrode 226, and are electrically connected to the ground electrode 242 through a via electrode 253. End portions at short sides of the half-wavelength resonators 222 and 224 are provided with via electrodes 251 and 255, respectively, and are electrically connected to the input/output load capacitor electrodes 234 and 236 on the dielectric layer 215 via the via electrodes 251 and 255, respectively.

The input/output load capacitor electrodes 234 and 236 are arranged on the dielectric layer 215 so that the input/output load capacitor electrodes 234 and 236 face the input/output capacitor electrodes 230 and 232 via the dielectric layer 214, respectively. The input capacitor electrode 230 and the input load capacitor electrode 234 face each other, so that an input capacitor C1 is formed. The output capacitor electrode 232 and the output load capacitor electrode 236 face each other, so that an output capacitor C2 is formed.

The input/output load capacitor electrode 234 faces the ground electrode 242 via the dielectric layer 215, so that an input/output load capacitor C4 is formed. The input/output load capacitor electrode 236 faces the ground electrode 242, so that an input/output load capacitor C5 is formed.

The input/output coupling capacitor electrode 228 is substantially rectangular, and is arranged on the dielectric layer 213 so that it faces the input/output capacitor electrodes 230 and 232 via the dielectric layer 213. The input/output capacitor electrodes 230 and 232 and the input/output coupling capacitor electrode 228 form an input/output coupling capacitor C3.

FIG. 10 is an equivalent circuit diagram of the multilayer bandpass filter illustrated in FIG. 9. In FIG. 10, an inductor L1 corresponds to a via electrode 261 for electrically connecting the input/output electrode 238 and the input/output capacitor electrode 230 illustrated in FIG. 9 to each other, and an inductor L2 corresponds to a via electrode 263 for electrically connecting the input/output electrode 240 and the input/output capacitor electrode 232 illustrated in FIG. 9 to each other. An inductor L3 corresponds to the via electrode 253 for electrically connecting the ground electrode 242 and the conductor electrode 226 for coupling the end portions at the long sides of the half-wavelength resonators 222 and 224 illustrated in FIG. 9. An inductor L4 corresponds to the via electrode 251 for connecting the end portion at the short side of the half-wavelength resonator 222 and the input/output load capacitor electrode 234 illustrated in FIG. 9. An inductor L5 corresponds to the via electrode 255 for connecting the end portion at the short side of the half-wavelength resonator 224 and the input/output load capacitor electrode 236 illustrated in FIG. 9.

In general high-frequency circuit systems, the input and output impedance values of a filter are set to desired values so as to prevent the loss of an electric signal caused by impedance mismatching and achieve impedance matching between electronic components included in the system. In the multilayer bandpass filter 200, input and output impedance values are set to desired values with the ratio between the values of the input capacitor C1 and the input/output load capacitor C4 illustrated in FIG. 10 and the ratio between the values of the output capacitor C2 and the input/output load capacitor C5 illustrated in FIG. 10.

The input and output impedance values of the multilayer bandpass filter 200 are also determined by the degree of electromagnetic coupling between the half-wavelength resonators 222 and 224, that is, the distance between the half-wavelength resonators 222 and 224.

Accordingly, in order to set desired impedance values, it is necessary to set a predetermined distance between the half-wavelength resonators. When the distance between resonators is long, the entire size of a component is increased.

When the distance between resonators is changed, the positions of the via electrodes 251 and 255, each of which is disposed at the short side of a corresponding one of the resonators, are changed. As a result, it is necessary to change the positions of the input/output load capacitor electrode 234 connected to the via electrode 251, the input/output load capacitor electrode 236 connected to the via electrode 255, and other electrodes on the paths of the via electrodes 251 and 255. Consequently, it is necessary to redesign a component. This leads to reduction in design flexibility.

SUMMARY OF THE INVENTION

Preferred embodiments of the present invention provide a multilayer bandpass filter that has significantly reduced size and great design flexibility of an impedance value.

A multilayer bandpass filter according to a preferred embodiment of the present invention includes a plurality of dielectric layers, a capacitor electrode, an inductor electrode, a ground electrode, and first and second via electrodes each passing through corresponding ones of the plurality of dielectric layers. The capacitor electrode faces the ground electrode to define a capacitor. The inductor electrode includes one end portion that is connected to the capacitor electrode by the first via electrode and another end portion that is connected to the ground electrode by the second via electrode, and the first and second via electrodes and the inductor electrode define an inductor. A plurality of LC parallel resonator circuits each including the capacitor and the inductor are arranged. A via coupling electrode electrically connects one of the first and second via electrodes in the inductor in one of the plurality of LC parallel resonator circuits and one of the first and second via electrodes in the inductor in another one of the plurality of LC parallel resonator circuits which is adjacent to the LC parallel resonator circuit.

In this case, it is possible to freely and accurately adjust the impedance value of the multilayer bandpass filter by changing the thickness of a dielectric layer on which the via coupling electrode is disposed and the position of the dielectric layer in the thickness direction.

When the inductor is defined as a loop extending from the capacitor electrode to the ground electrode via the inductor electrode, the plurality of LC parallel resonator circuits are preferably arranged so that the loops of the plurality of LC parallel resonator circuits partially overlap, and directions of the loops of the adjacent ones of the plurality of LC parallel resonator circuits are preferably set to the same direction when the loops are viewed from one direction in which the plurality of LC parallel resonator circuits are arranged.

In this case, by setting directions of loops defined by inductors in LC parallel resonators coupled to each other by the via coupling electrode to the same direction, these LC parallel resonators can be efficiently coupled to each other. Accordingly, a multilayer bandpass filter having a good Q factor can be achieved.

A common via electrode is preferably used to connect the via electrodes connected by the via coupling electrode from the via coupling electrode to the ground electrode.

In this case, by disposing the common via electrode, the area of a region in which a capacitor electrode can be provided is increased. The size reduction of the multilayer bandpass filter can be therefore achieved.

A plurality of via coupling electrodes are preferably provided.

In this case, by disposing a plurality of via coupling electrodes, it is possible to separately adjust an input-side inductance and an output-side inductance in an LC parallel resonator. Accordingly, the design flexibility of the multilayer bandpass filter is further improved.

According to various preferred embodiments of the present invention, it is possible to provide a multilayer bandpass filter that has significantly reduced size and great design flexibility and high design accuracy of an impedance value.

The above and other features, elements, steps, characteristics and advantages of the present invention will become more apparent from the following detailed description of preferred embodiments of the present invention with reference to the attached drawings.

DETAILED DESCRIPTION OF THE PREFERRED EMBODIMENTS

A multilayer filter according to preferred embodiments of the present invention will be described below with reference to the accompanying drawings.

First Preferred Embodiment

Figure 1:
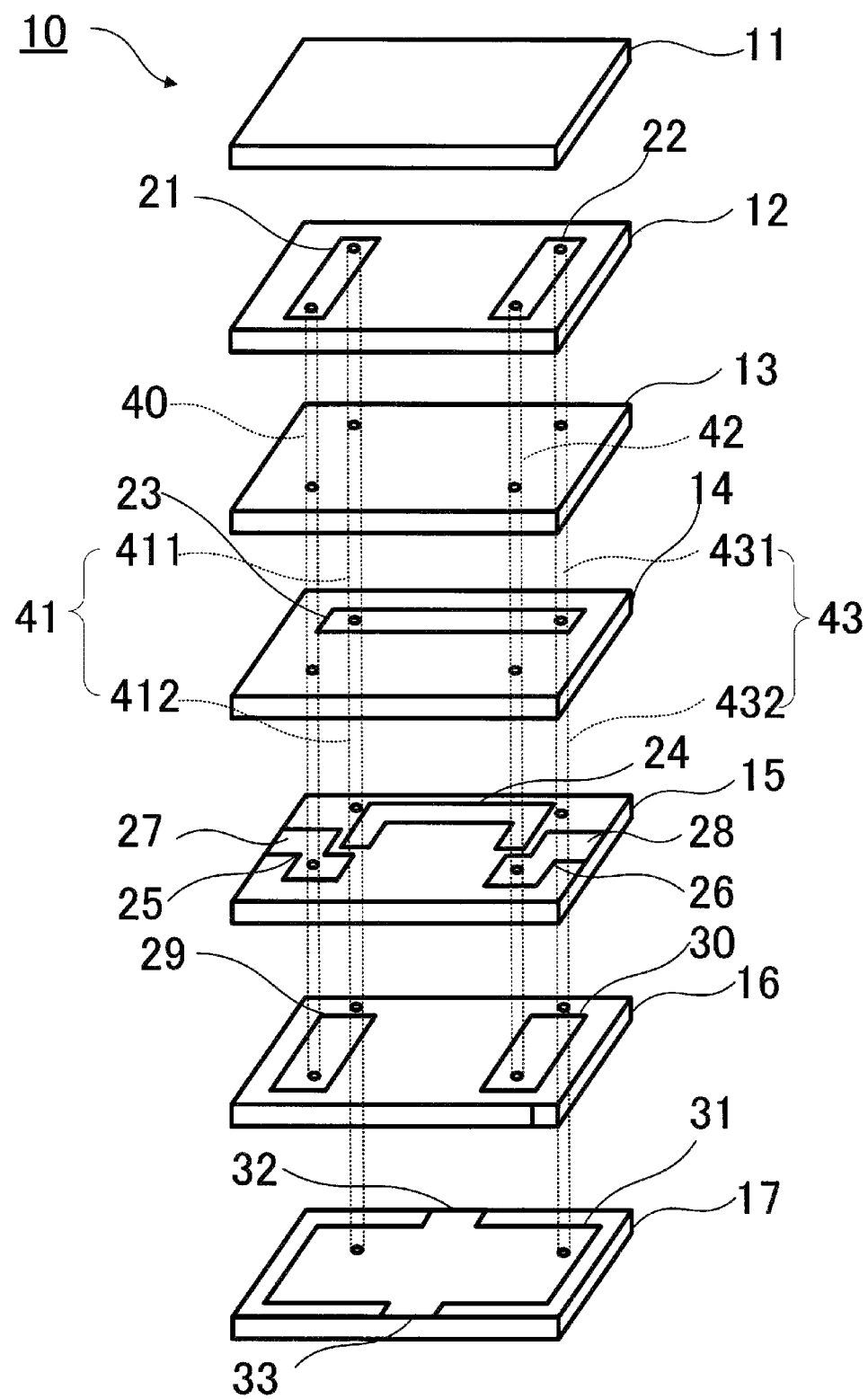
FIG. 1 is an exploded perspective view of a multilayer bandpass filter according to a first preferred embodiment of the present invention.
Figure 2:
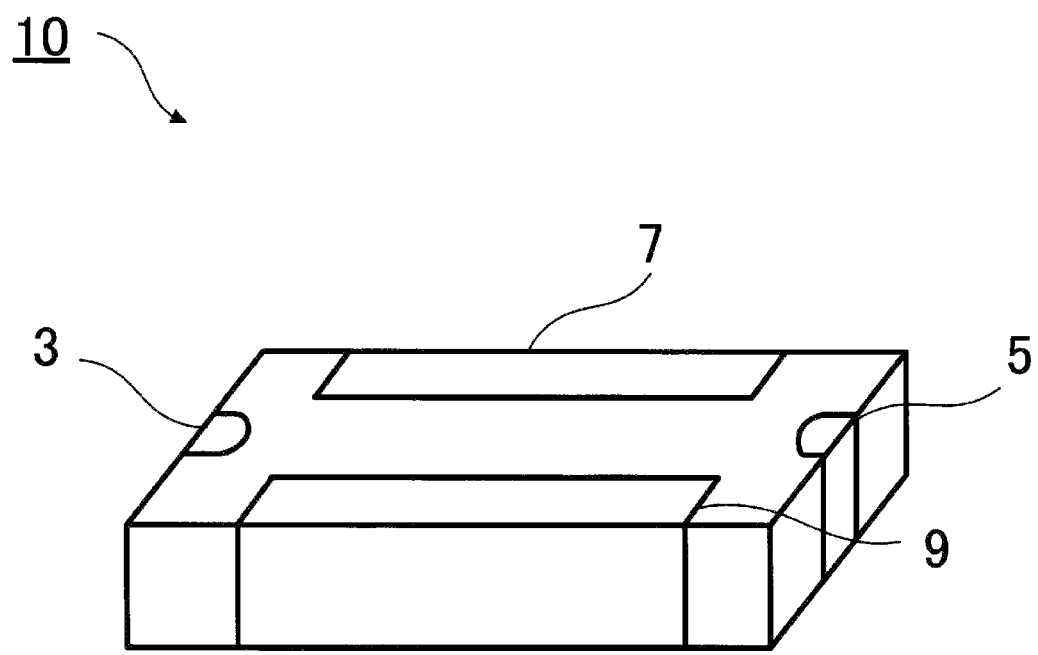
FIG. 2 is an external perspective view of a multilayer bandpass filter according to the first preferred embodiment of the present invention.
Figure 3:
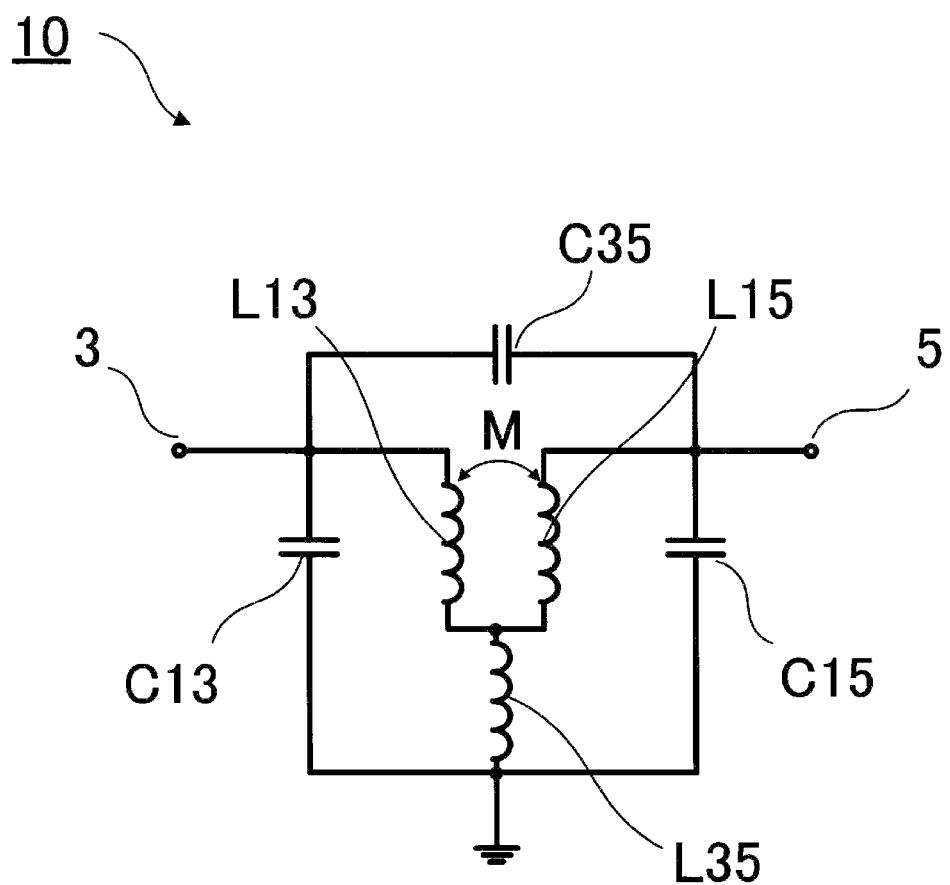
FIG. 3 is an equivalent circuit diagram of a multilayer bandpass filter according to the first preferred embodiment of the present invention.

The configuration of a multilayer bandpass filter according to the first preferred embodiment of the present invention is illustrated in FIGS. 1 to 3. FIG. 1 is an exploded perspective view of a multilayer bandpass filter 10. FIG. 2 is an external perspective view of the multilayer bandpass filter 10. FIG. 3 is an equivalent circuit diagram of the multilayer bandpass filter 10.

As illustrated in FIG. 1, in the multilayer bandpass filter 10 according to the first preferred embodiment, a plurality of dielectric layers 12, 14, 15, 16, and 17 and dummy dielectric layers 11 and 13 are laminated. On each of the dielectric layers 12, 14, 15, 16, and 17, a predetermined electrode pattern is formed.

The dielectric layers 11 to 17 are created by applying slurry made of a ceramic dielectric material such as barium titanate to a film with a doctor blade method.

An electrode pattern is formed by applying photosensitive conductive paste to an insulating layer using a spin coating method and performing a photolithography method. Alternatively, an electrode pattern may be formed by directly applying conductive paste to an insulating layer via a metal mask using a screen printing method.

In the following preferred embodiments, the above-described dielectric layer creation method and the above-described electrode pattern creation method are preferably used, for example.

First, electrode patterns and via electrodes disposed on the dielectric layers 12 to 17 will be described in detail below.

On the dielectric layer 15, input/output electrodes 25 and 26 and a third capacitor electrode 24 are disposed. The input/output electrodes 25 and 26 preferably are substantially rectangular, and are individually formed in central portions of short sides of the dielectric layer 15. A lead electrode 27 allows the input/output electrode 25 to extend to one short side of the dielectric layer 15, and a lead electrode 28 allows the input/output electrode 26 to extend to the other short side of the dielectric layer 15. The third capacitor electrode 24 is, for example, substantially U-shaped, and is arranged to extend along one long side of the dielectric layer 15.

A ground electrode 31 is disposed on a substantially entire surface of the dielectric layer 17. Lead electrodes 32 and 33 allow the ground electrode 31 to individually extend to the long sides of the dielectric layer 17.

On the dielectric layer 16, a first capacitor electrode 29 and a second capacitor electrode 30, which are individually included in LC resonators, are provided. The first capacitor electrode 29 is disposed along one short side of the dielectric layer 16 so that it faces one end portion of the third capacitor electrode 24. The second capacitor electrode 30 is disposed along the other short side of the dielectric layer 16 so that it faces the other end portion of the third capacitor electrode 24. The first capacitor electrode 29 and the second capacitor electrode 30 are disposed so that they face the ground electrode 31 via the dielectric layer 16. The first capacitor electrode 29 and the second capacitor electrode 30 are electrically connected to the input/output electrodes 25 and 26 via portions of via electrodes 40 and 42, respectively.

On the dielectric layer 12, a first inductor electrode 21, a second inductor electrode 22, the via electrode 40, via electrodes 41 and 43, and the via electrode 42 are disposed. On the dielectric layer 14, a via coupling electrode 23 is disposed. The first inductor electrode 21 is substantially rectangular, and is disposed along one short side of the dielectric layer 12. One end portion of the first inductor electrode 21 is electrically connected to the first capacitor electrode 29 via the input electrode 25 by the via electrode 40. The other end portion of the first inductor electrode 21 is electrically connected to the ground electrode 31 via the via coupling electrode 23 by the via electrode 41. The second inductor electrode 22 is substantially rectangular, and is disposed along the other short side of the dielectric layer 12. One end portion of the second inductor electrode 22 is electrically connected to the second capacitor electrode 30 via the output electrode 26 by the via electrode 42. The other end portion of the second inductor electrode 22 is electrically connected to the ground electrode 31 through the via coupling electrode 23 by the via electrode 43.

The via coupling electrode 23 electrically connects the via electrodes 41 and 43 to each other on the dielectric layer 14. The via coupling electrode 23 separates the via electrode 41 into a via electrode 411 on the side of the inductor electrode and a via electrode 412 on the side of the ground electrode, and separates the via electrode 43 into a via electrode 431 on the side of the inductor electrode and a via electrode 432 on the side of the ground electrode.

In this preferred embodiment, the via coupling electrode 23 is disposed to connect the via electrodes 41 and 43 to each other, but may be disposed to connect one of the via electrodes 40 and 41 and one of the via electrodes 42 and 43 to each other.

Next, first, second, and third capacitors will be described in detail below.

The first capacitor electrode 29 and the ground electrode 31 face each other, so that the first capacitor is provided. The second capacitor electrode 30 and the ground electrode 31 face each other, so that the second capacitor is provided. The third capacitor electrode 24 faces the first capacitor electrode 29 and the second capacitor electrode 30, so that the third capacitor is formed.

Next, first, second, and third inductors will be described in detail below.

The first inductor electrode 21 and the via electrodes and 411 define the first inductor. The second inductor electrode 22 and the via electrodes 42 and 431 define the second inductor. The via coupling electrode 23 and the via electrodes 412 and 432 define the third inductor.

Next, first and second LC parallel resonators will be described in detail below.

The first inductor has a center axis in a direction perpendicular to the lamination direction of the multilayer bandpass filter 10, and has a loop extending from the connection point (starting point) between the via electrode 40 and the first capacitor electrode 29 to the connection point (endpoint) between the via electrode 41 and the ground electrode 31. Accordingly, the first LC parallel resonator at an input side is defined by the first inductor and the first capacitor.

The second inductor also has a center axis in a direction perpendicular to the lamination direction of the multilayer bandpass filter 10, and has a loop extending from the connection point (starting point) between the via electrode 42 and the second capacitor electrode 30 to the connection point (endpoint) between the via electrode 43 and the ground electrode 31. Accordingly, the second LC parallel resonator at an output side is formed by the second inductor and the second capacitor.

A loop electrode included in the first LC parallel resonator and a loop electrode included in the second LC parallel resonator are disposed so that the loop surfaces of the loop electrodes overlap each other as viewed from a direction perpendicular to the lamination direction and the center axes of the loop electrodes are parallel to each other.

FIG. 2 is an external perspective view of the multilayer bandpass filter 10. The dielectric layers 11 to 17 are laminated in this order. The stack of the dielectric layers to 17 and a wiring electrode are fired at the same time. Subsequently, external input/output electrodes 3 and 5 are formed so that the external input/output electrodes 3 and 5 are connected to the lead electrode 27 of the input/output electrode 25 and the lead electrode 28 of the input/output electrode 26, respectively. External ground electrodes 7 and 9 are formed so that the external ground electrodes 7 and 9 are connected to the lead electrodes 32 and 33 of the ground electrode 31, respectively. Consequently, the multilayer bandpass filter 10 illustrated in FIG. 2 is formed. The external input/output electrodes 3 and 5 are individually formed on side surfaces on the short sides of the multilayer bandpass filter 10. The external ground electrodes 7 and 9 are individually disposed on side surfaces on the long sides of the multilayer bandpass filter 10.

FIG. 3 is an equivalent circuit diagram of the multilayer bandpass filter 10 illustrated in FIG. 1. In FIG. 3, capacitors C13, C15, and C35 correspond to the first capacitor, the second capacitor, and the third capacitor, respectively.

Inductors L13, L15, and L35 correspond to the first inductor, the second inductor, and the third inductor, respectively.

According to the first preferred embodiment of the present invention, when a current passes through the via electrodes 40 to 43, a magnetic field is generated around each of these via electrodes in a direction perpendicular to a dielectric layer lamination direction. As a result, the via electrodes 40 and 41 are coupled to each other by magnetic field coupling, and the via electrodes 42 and 43 are coupled to each other by magnetic field coupling. When a current passes through the first inductor electrode 21 and the second inductor electrode 22, a magnetic field is generated around each of these inductor electrodes in a direction parallel to a dielectric layer lamination direction. As a result, the first inductor electrode 21 and the second inductor electrode 22 are coupled to each other by magnetic field coupling.

In particular, since the direction of a magnetic field generated at each of the via electrodes 40 to 43 is parallel to the ground electrode 31, the magnetic field and the ground electrode 31 do not intersect with each other. Accordingly, it is possible to prevent the occurrence of an overcurrent at the ground electrode 31 and increase the Q factors of the first and second inductors.

Furthermore, according to the first preferred embodiment, the degree of coupling between the first LC parallel resonator and the second LC parallel resonator can be determined in accordance with a ratio between the inductance value of the inductors L13 and L15 and the inductance value of the inductor L35. In reality, the ratio between the inductance value of the inductors L13 and L15 and the inductance value of the inductor L35 is determined in accordance with the position of the dielectric layer 14, on which the via coupling electrode 23 is formed, in a lamination direction, and can be accurately adjusted by changing the thicknesses of the dielectric layer 14 and the via coupling electrode 23.

Even if the ratio between the inductance value of the inductors L13 and L15 and the inductance value of the inductor L35 is changed, inductance values of inductors included in the first and second LC parallel resonator are not changed. Accordingly, it is possible to adjust the degree of coupling between two LC parallel resonators without changing the resonance frequencies of the LC parallel resonators.

On the other hand, the impedance value of the multilayer bandpass filter 10 is determined in accordance with the degree of coupling between the first LC parallel resonator on the input side and the second LC parallel resonator on the output side. Accordingly, it is possible to freely and accurately adjust the impedance value of the multilayer bandpass filter 10 by disposing the via coupling electrode 23 and changing the position of the via coupling electrode 23 in the lamination direction and the thickness of the via coupling electrode 23.

Second Preferred Embodiment

Figure 4:
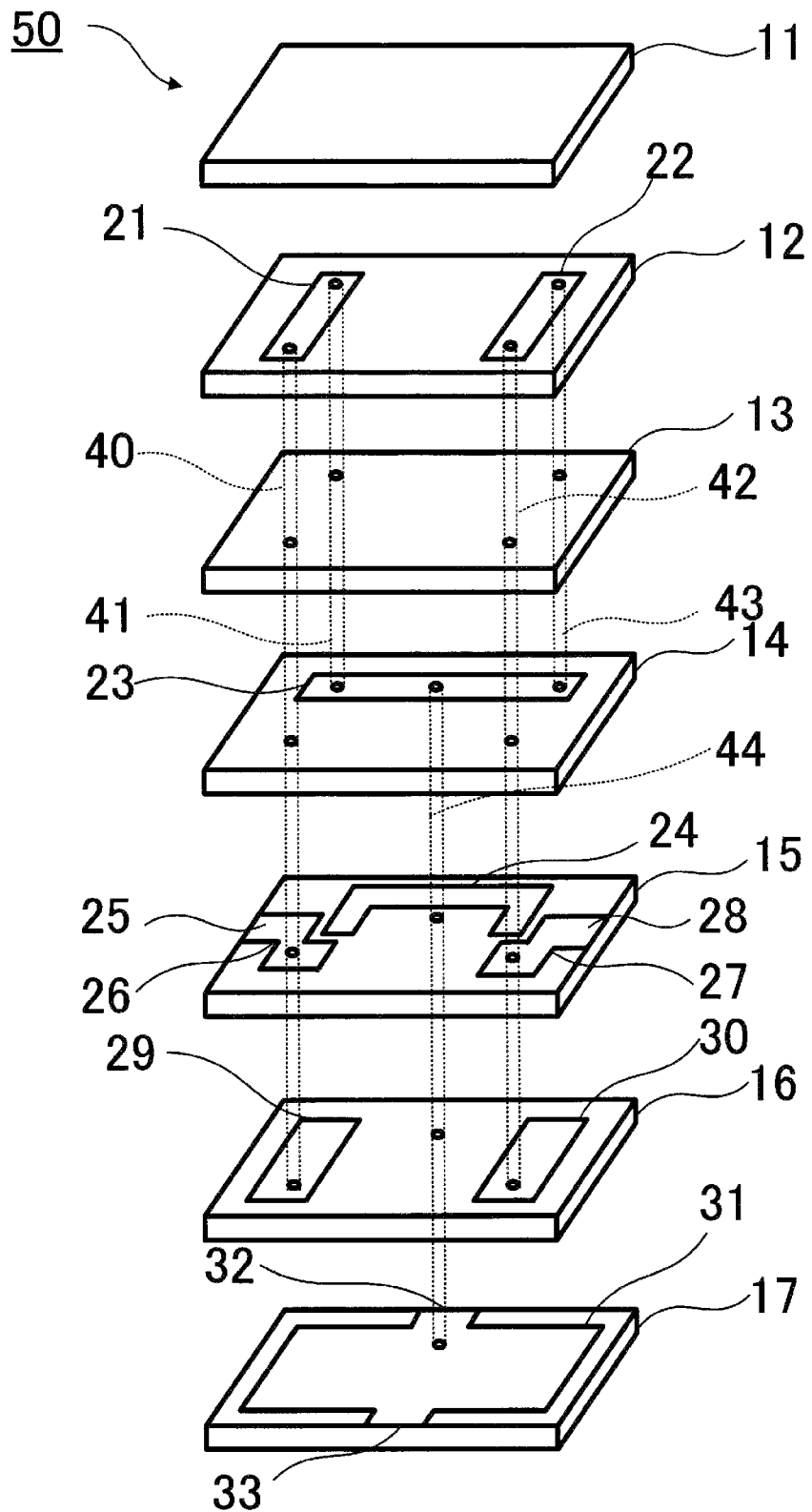
FIG. 4 is an exploded perspective view of a multilayer bandpass filter according to a second preferred embodiment of the present invention.

The configuration of a multilayer bandpass filter according to the second preferred embodiment of the present invention is illustrated in FIG. 4. FIG. 4 is an exploded perspective view of a multilayer bandpass filter 50 according to the second preferred embodiment. Since the external perspective view of the multilayer bandpass filter 50 is the same as that illustrated in FIG. 2 and the equivalent circuit diagram of the multilayer bandpass filter 50 is the same as that illustrated in FIG. 3, the illustration thereof will be therefore omitted. In FIG. 4, the same reference numerals are used to identify elements already described with reference to FIG. 1 so as to avoid repeated explanation.

In the multilayer bandpass filter 50, instead of the via electrodes 412 and 432 according to the first preferred embodiment, a common via electrode 44 is used. The via electrode 44 is disposed at the center of the via coupling electrode 23. The via coupling electrode 23 is electrically connected to the ground electrode 31 via the via electrode 44. The via coupling electrode 23 and the via electrode 44 define a substantially T-shaped circuit. The first inductor and the second inductor are connected to the ground electrode 31 by the substantially T-shaped circuit.

In this preferred embodiment, a via coupling electrode is disposed to connect the via electrodes 41 and 43 to each other. However, the via coupling electrode may connect one of the via electrodes 40 and 41 and one of the via electrodes 42 and 43 to each other and be connected to the ground electrode 31 by the via electrode 44.

According to the second preferred embodiment, the effects and advantages of the first preferred embodiment can be obtained. In addition, it is possible to reduce a region required for the formation of via electrodes by connecting the via coupling electrode 23 and the ground electrode 31 to each other with the via electrode 44. As a result, since the area of a region in which capacitor electrodes are formed can be increased, the size reduction of a multilayer bandpass filter can be achieved.

Furthermore, since the via coupling electrode 23 is connected to the ground electrode 31 by the via electrode 44, the area of a region in the via coupling electrode 23 in which the via electrode 44 is formed can be increased. As a result, it is possible to increase the cross-sectional area of the via electrode 44, increase the Q factors of the first and second inductors, and achieve a low insertion loss in the multilayer bandpass filter 50.

The via electrode 44 is disposed at the center of the via coupling electrode 23 in this preferred embodiment, but may be disposed on the left or right side of the via coupling electrode 23. Since the inductance values of the first and second inductors can be finely adjusted by changing the position of the via electrode 44, the resonance frequencies of LC parallel resonators can be freely adjusted.

Third Preferred Embodiment

Figure 5:
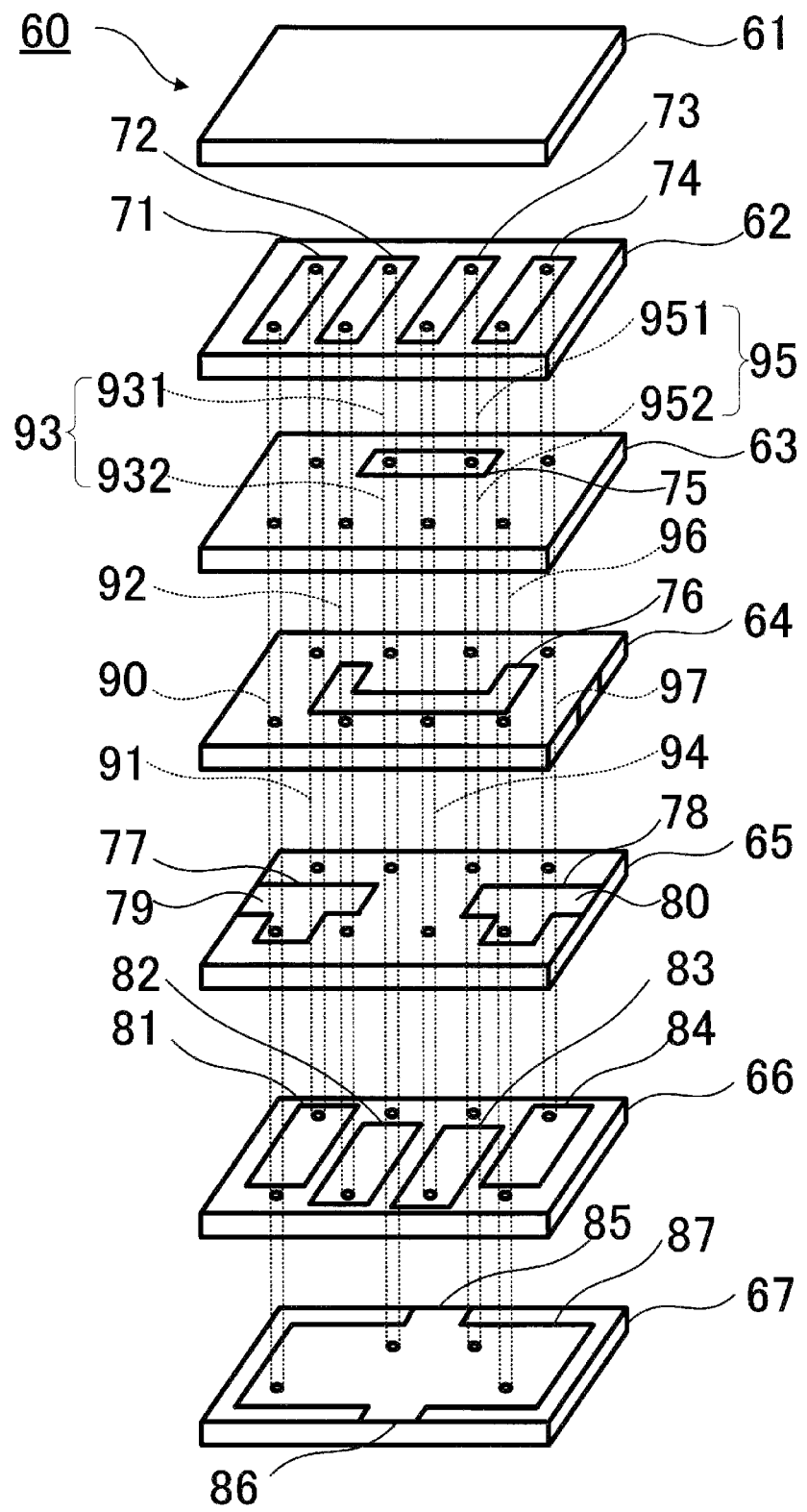
FIG. 5 is an exploded perspective view of a multilayer bandpass filter according to a third preferred embodiment of the present invention.
Figure 6:
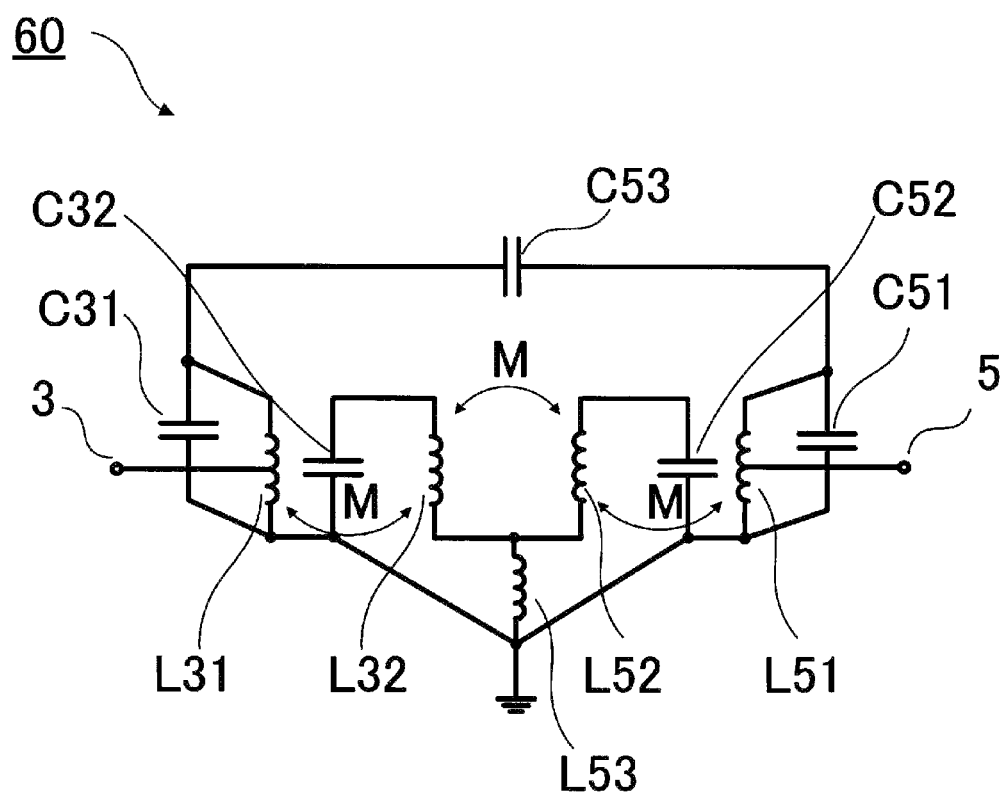
FIG. 6 is an equivalent circuit diagram of a multilayer bandpass filter according to the third preferred embodiment of the present invention.

The configuration of a multilayer bandpass filter according to the third preferred embodiment of the present invention is illustrated in FIGS. 5 and 6. FIG. 5 is an exploded perspective view of a multilayer bandpass filter 60 according to the third preferred embodiment. FIG. 6 is an equivalent circuit diagram of the multilayer bandpass filter 60. Since the external perspective view of the multilayer bandpass filter 60 is the same as that illustrated in FIG. 2, the illustration thereof will be therefore omitted.

As illustrated in FIG. 5, in the multilayer bandpass filter 60 according to the third preferred embodiment, a plurality of dielectric layers 62, 63, 64, 65, 66, and 67 on which predetermined electrode patterns are individually formed and a dummy dielectric layer 61 are laminated.

First, an electrode pattern disposed on each of the dielectric layers 62 to 67 and via electrodes will be described in detail below.

On the dielectric layer 65, input/output electrodes 77 and 78 are disposed. The input/output electrodes 77 and 78 are individually disposed in central portions of short sides of the dielectric layer 65. A lead electrode 79 allows the input/output electrode 77 to extend to one short side of the dielectric layer 65, and a lead electrode 80 allows the input/output electrode 78 to extend to the other short side of the dielectric layer 65.

On the dielectric layer 64, a coupling capacitor 76 is formed. The coupling capacitor 76 is, for example, substantially U-shaped, and is disposed at the center of the dielectric layer 64 so that one end portion thereof faces the input electrode 77 and the other end portion thereof faces the output electrode 78.

On the dielectric layer 66, a first capacitor electrode 81, a second capacitor electrode 82, a third capacitor electrode 83, and a fourth capacitor electrode 84, which are individually included in LC parallel resonator circuits, are disposed. The first capacitor electrode 81 to the fourth capacitor electrode 84 are arranged at regular intervals in parallel or substantially in parallel with each other. Furthermore, the first capacitor electrode 81 and the fourth capacitor electrode 84 are disposed so that the first capacitor electrode 81 and the fourth capacitor electrode 84 face the input electrode 77 and the output electrode 78, respectively.

A ground electrode 87 is disposed on a substantially entire surface of the dielectric layer 67. Lead electrodes 85 and 86 allow the ground electrode 87 to extend to the long sides of the dielectric layer 67. The input/output electrodes 77 and are electrically connected to the ground electrode 87 via parts of via electrodes 90 and 96, respectively.

On the dielectric layer 62, a first inductor electrode 71, a second inductor electrode 72, a third inductor electrode 73, and a fourth inductor electrode 74 are arranged in parallel or substantially in parallel with each other. The via electrode 90 and a via electrode 91 are individually disposed at end portions of the first inductor electrode 71. Via electrodes 92 and 93 are individually disposed at end portions of the second inductor electrode 72. Via electrodes 94 and 95 are individually disposed at end portions of the third inductor electrode 73. The via electrode 96 and a via electrode 97 are individually disposed at end portions of the fourth inductor electrode 74. On the dielectric layer 63, a via coupling electrode 75 that is substantially rectangular is provided.

One end portion of the first inductor electrode 71 is electrically connected to the ground electrode 87 via the input electrode 77 by the via electrode 90, and the other end portion of the first inductor electrode 71 is electrically connected to the first capacitor electrode 81 by the via electrode 91. One end portion of the second inductor electrode 72 is electrically connected to the second capacitor electrode 82 by the via electrode 92, and the other end portion of the second inductor electrode 72 is electrically connected to the ground electrode 87 via one end portion of the via coupling electrode 75 by the via electrode 93. One end portion of the third inductor electrode 73 is electrically connected to the third capacitor electrode 83 by the via electrode 94, and the other end portion of the third inductor electrode 73 is electrically connected to the ground electrode 87 via the other end portion of the via coupling electrode 75 by the via electrode 95. One end portion of the fourth inductor electrode 74 is electrically connected to the ground electrode 87 via the output electrode 78 by the via electrode 96, and the other end portion of the fourth inductor electrode 74 is electrically connected to the fourth capacitor electrode 84 by the via electrode 97.

The via coupling electrode 75 electrically connects the via electrodes 93 and 95 to each other on the dielectric layer 63. The via coupling electrode 75 separates the via electrode 93 into a via electrode 931 on the side of the inductor electrode and a via electrode 932 on the side of the ground electrode, and separates the via electrode 95 into a via electrode 951 on the side of the inductor electrode and a via electrode 952 on the side of the ground electrode.

In this preferred embodiment, the via coupling electrode 75 connects the via electrodes 93 and 95 to each other, but may connect one of the via electrodes 92 and 93 and one of the via electrodes 94 and 95 to each other.

Next, first, second, third, fourth, and fifth capacitors will be described in detail below.

The first capacitor electrode 81 and the ground electrode 87 face each other, so that the first capacitor is provided. The second capacitor electrode 82 and the ground electrode 87 face each other, so that the second capacitor is provided. The third capacitor electrode 83 and the ground electrode 87 face each other, so that the third capacitor is provided. The fourth capacitor electrode 84 and the ground electrode 87 face each other, so that the fourth capacitor is provided. The input/output electrodes 77 and 78 simultaneously face the coupling capacitor 76, so that the fifth capacitor is provided.

Next, first, second, third, fourth, and fifth inductors will be described in detail below.

The first inductor electrode 71 and the via electrodes and 91 define the first inductor. The second inductor electrode 72 and the via electrodes 92 and 931 define the second inductor. The third inductor electrode 73 and the via electrodes and 951 define the third inductor. The fourth inductor electrode 74 and the via electrodes 96 and 97 define the fourth inductor. The via coupling electrode 75 and the via electrodes 932 and 952 define the fifth inductor.

Next, first, second, third, and fourth LC parallel resonators will be described in detail below.

The first, second, third, and fourth LC parallel resonators are defined by the first, second, third, and fourth inductors and the first, second, third, and fourth capacitors, respectively. Each of the first to fourth inductors has a center axis in a direction perpendicular to the lamination direction of the multilayer bandpass filter 60. The first inductor has a loop extending from the connection point (starting point) between the via electrode 91 and the first capacitor electrode to the connection point (endpoint) between the via electrode 90 and the ground electrode 87. The second inductor has a loop extending from the connection point (starting point) between the via electrode 92 and the second capacitor electrode to the connection point (endpoint) between the via electrode 931 and the via coupling electrode 75. The third inductor has a loop extending from the connection point (starting point) between the via electrode 94 and the third capacitor electrode to the connection point (endpoint) between the via electrode 951 and the via coupling electrode 75. The fourth inductor has a loop extending from the connection point (starting point) between the via electrode 97 and the fourth capacitor electrode to the connection point (endpoint) between the via electrode 96 and the ground electrode 87. Accordingly, the relationship among each LC parallel resonator, an inductor electrode, a capacitor electrode, and a via electrode is as illustrated in table 1.

TABLE 1

| LC Parallel Resonator | Via Electrode | Capacitor Electrode | Inductor Electrode | Loop Direction |
| --- | --- | --- | --- | --- |
| First | 90, 91 | 81 | 71 | 1 |
| Second | 92, 931 | 82 | 72 | 0 |
| Third | 94, 951 | 83 | 73 | 0 |
| Fourth | 96, 97 | 84 | 74 | 1 |

A loop direction in table 1 is a rotation direction of a loop extending from its starting point as viewed from one direction in which LC parallel resonators are arranged. For example, when the loop of an inductor included in each LC parallel resonator is viewed in a direction from the input electrode 77 to the output electrode 78 in FIG. 5, the first inductor defines a loop extending in a clockwise direction from the connection point (starting point) between the via electrode 91 and the first capacitor electrode 81 to the connection point (endpoint) between the via electrode 90 and the ground electrode 87 via the via electrode 91, the first inductor electrode 71, and the via electrode 90. Furthermore, the second inductor defines a loop extending in a counterclockwise direction from the connection point (starting point) between the via electrode 92 and the second capacitor electrode 82 to the connection point (endpoint) between the via electrode 93 and the ground electrode 87 via the via electrode 92 and the second inductor electrode 72. Since the loop extends either in the clockwise direction or in the counterclockwise direction, the clockwise direction is denoted by 1 and the counterclockwise direction is denoted by 0 in table 1.

The via electrode 93 included in the second inductor and the via electrode 95 included in the third inductor are electrically connected to each other by the via coupling electrode 75. As a result, the second LC parallel resonator and the third LC parallel resonator are coupled to each other.

FIG. 6 is an equivalent circuit diagram of the multilayer bandpass filter 60 illustrated in FIG. 5. In FIG. 6, capacitors C31, C32, C52, C51, and C53 correspond to the first, second, third, fourth, and fifth capacitors, respectively.

Inductors L31, L32, L52, L51, and L53 correspond to the first, second, third, fourth, and fifth inductors, respectively.

According to the third preferred embodiment, the effects and advantages of the first preferred embodiment can be obtained. In addition, since the loop directions of the second and third inductors, which are coupled to each other by the via coupling electrode 75, are the same, it is possible to efficiently achieve the coupling between LC parallel resonators. Accordingly, a multilayer bandpass filter having a good Q factor can be achieved.

Fourth Preferred Embodiment

Figure 7:
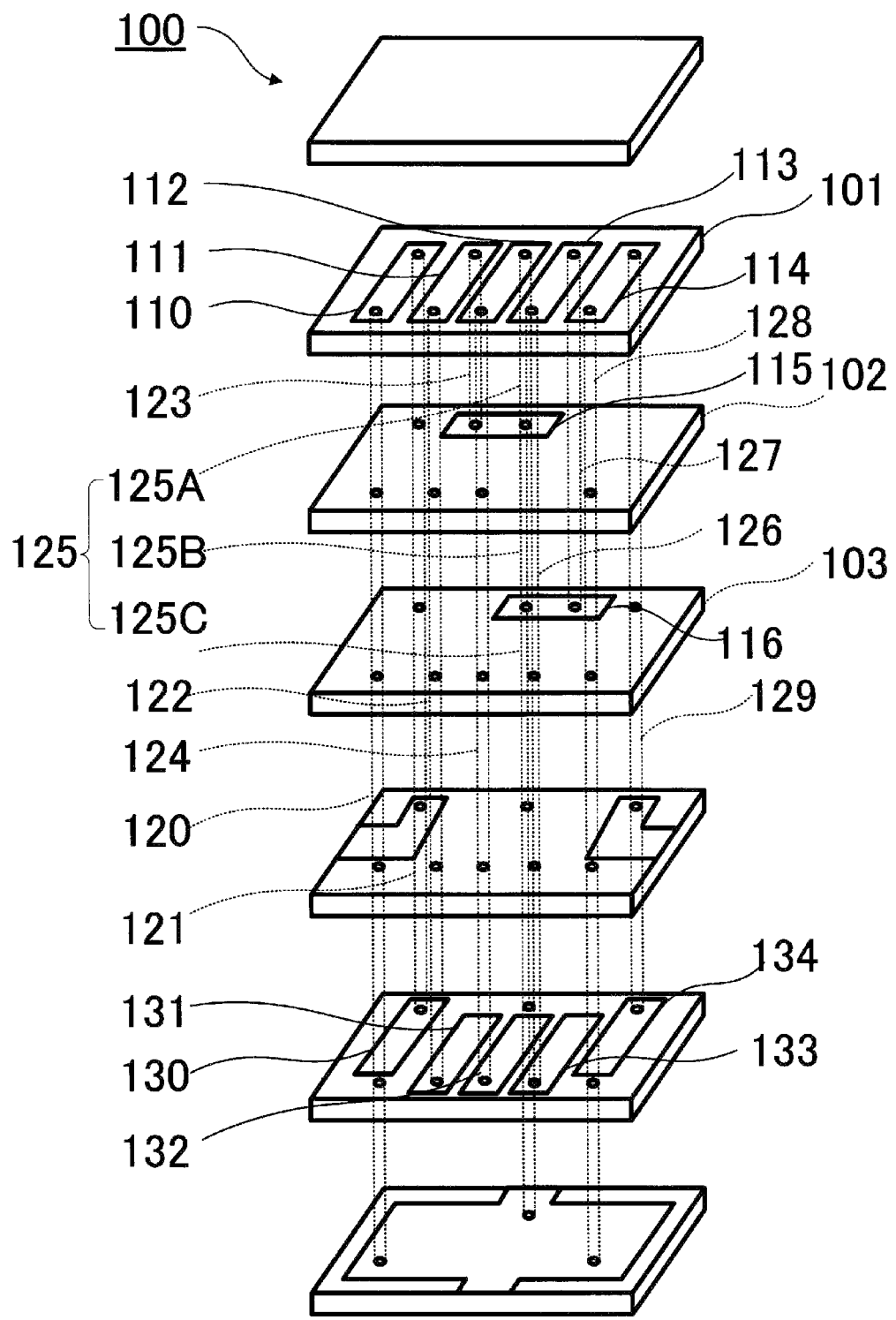
FIG. 7 is an exploded perspective view of a multilayer bandpass filter according to a fourth preferred embodiment of the present invention.
Figure 8:
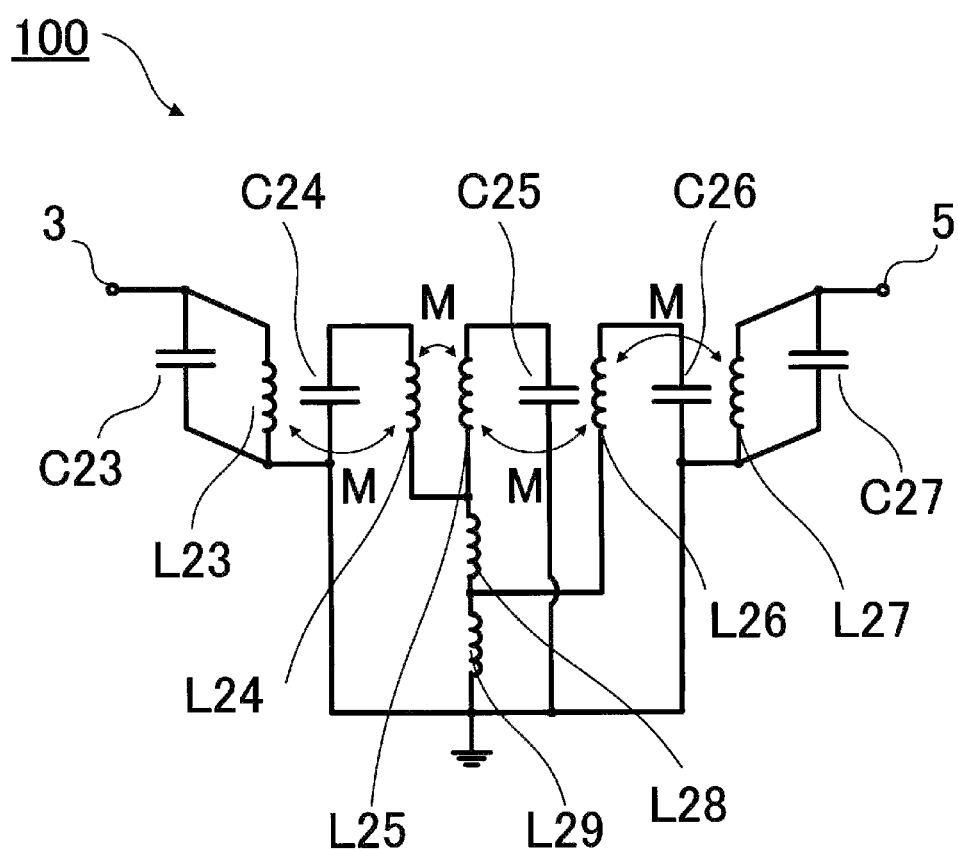
FIG. 8 is an equivalent circuit diagram of a multilayer bandpass filter according to the fourth preferred embodiment of the present invention.
Figure 9:
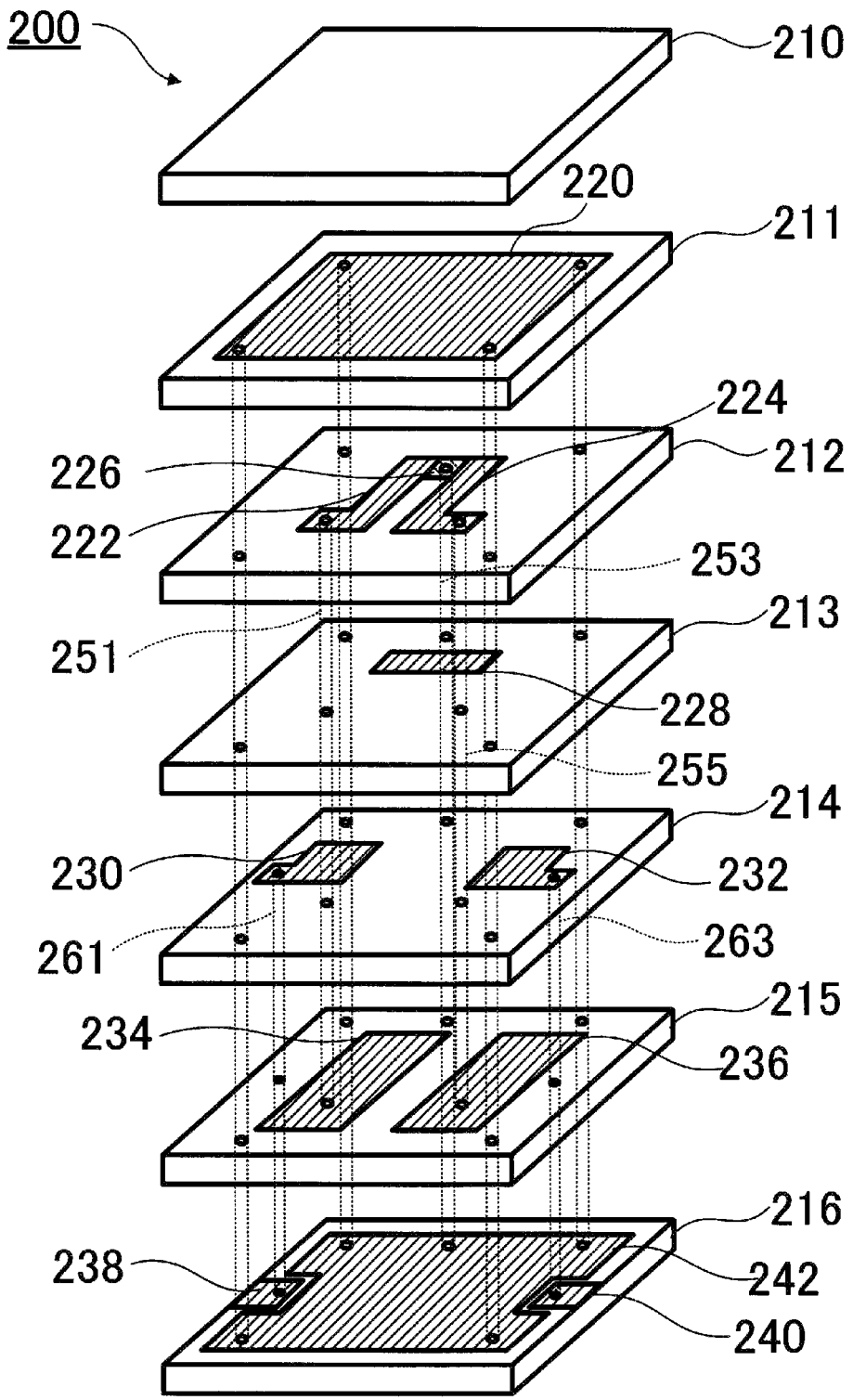
FIG. 9 is an exploded perspective view of a multilayer bandpass filter in the related art.
Figure 10:
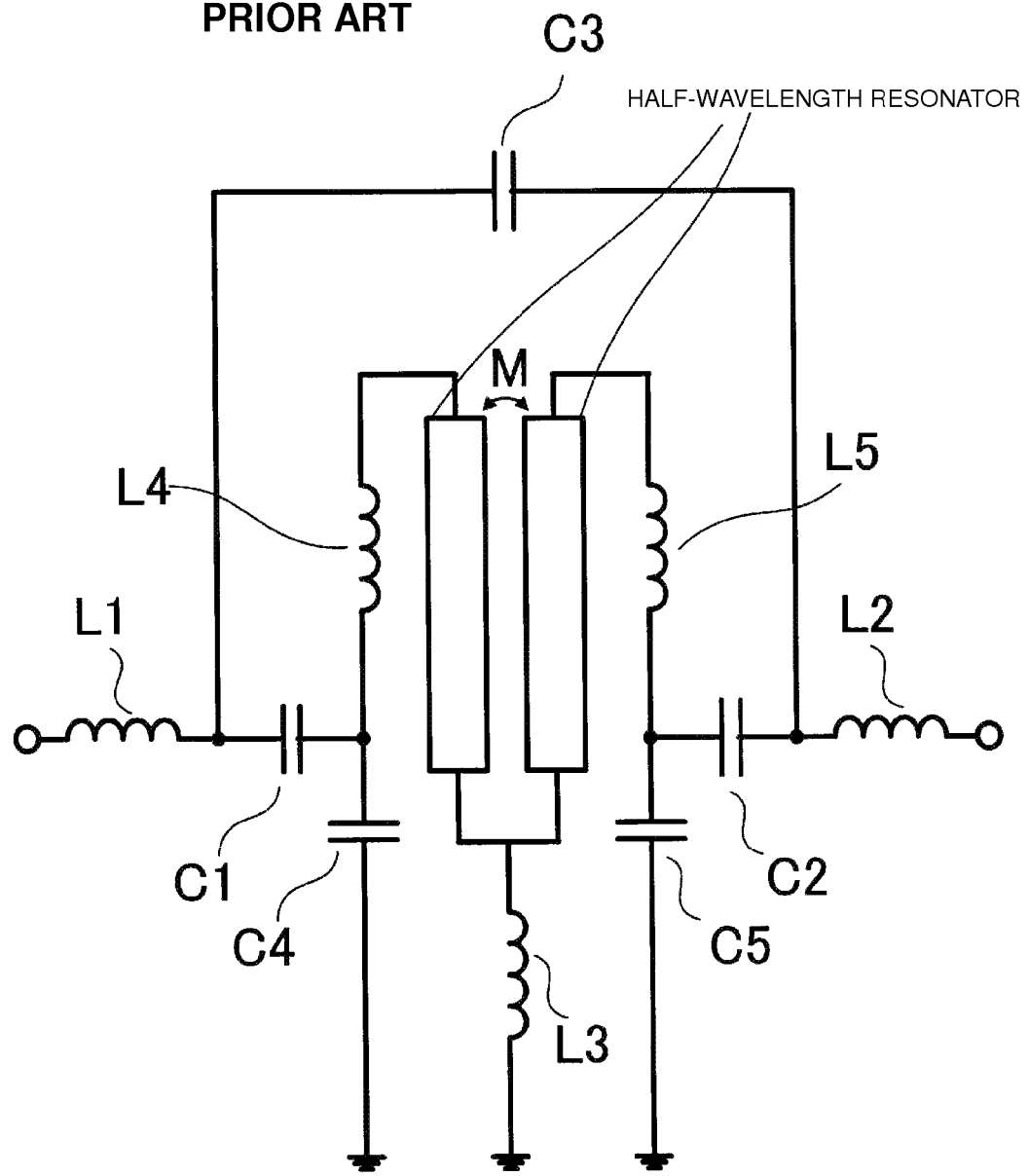
FIG. 10 is an equivalent circuit diagram of a multilayer bandpass filter in the related art.

The configuration of a multilayer bandpass filter according to the fourth preferred embodiment of the present invention is illustrated in FIGS. 7 and 8. FIG. 7 is an exploded perspective view of a multilayer bandpass filter 100 according to the fourth preferred embodiment. FIG. 8 is an equivalent circuit diagram of the multilayer bandpass filter 100. Since the external perspective view of the multilayer bandpass filter 100 is the same as that illustrated in FIG. 2, the illustration thereof will be therefore omitted.

In the multilayer bandpass filter 60 according to the third preferred embodiment, four LC parallel resonators, the first to fourth LC parallel resonators, are preferably included and the second LC parallel resonator and the third LC parallel resonator are coupled to each other by a single via coupling electrode. On the other hand, in the multilayer bandpass filter 100 according to the fourth preferred embodiment, five LC parallel resonators, first to fifth LC parallel resonators, are included and the coupling between the second and third LC parallel resonators and the coupling between the third and fourth LC parallel resonators are achieved by two via coupling electrodes. The configuration of the multilayer bandpass filter 100 according to the fourth preferred embodiment is the same as that of the multilayer bandpass filter 60 according to the third preferred embodiment other than the above-described points, and the description thereof will be therefore omitted.

First, the configurations of first to seventh inductors will be described in detail below.

On a dielectric layer 101, a first inductor electrode 110, a second inductor electrode 111, a third inductor electrode 112, a fourth inductor electrode 113, and a fifth inductor electrode 114 are disposed in parallel with each other. A via electrode 120 is disposed at one end portion of the first inductor electrode 110, and a via electrode 121 is disposed at the other end portion of the first inductor electrode 110. A via electrode 122 is disposed at one end portion of the second inductor electrode 111, and a via electrode 123 is disposed at the other end portion of the second inductor electrode 111. A via electrode 124 is disposed at one end portion of the third inductor electrode 112, and a via electrode 125 is disposed at the other end portion of the third inductor electrode 112. A via electrode 126 is disposed at one end portion of the fourth inductor electrode 113, and a via electrode 127 is disposed at the other end portion of the fourth inductor electrode 113. A via electrode 128 is disposed at one end portion of the fifth inductor electrode 114, and a via electrode 129 is disposed at the other end portion of the fifth inductor electrode 114.

Via coupling electrodes 115 and 116 are disposed on dielectric layers 102 and 103, respectively. The via coupling electrodes 115 and 116 separate the via electrode 125 into a via electrode 125A between the third inductor electrode 112 and the via coupling electrode 115, a via electrode 125B between the via coupling electrodes 115 and 116, and a via electrode 125C between the via coupling electrode 116 and the ground electrode. The via electrodes 125A and 123 are electrically connected to each other by the via coupling electrode 115. The via electrodes 125B and 127 are electrically connected to each other by the via coupling electrode 116.

In this preferred embodiment, the via coupling electrodes are disposed to connect the via electrodes 123 and 125 to each other and connect the via electrodes 125 and 127 to each other, but may be disposed to connect one of the via electrodes 122 and 123 and one of the via electrodes 124 and 125 to each other and connect one of the via electrodes 124 and 125 and one of the via electrodes 126 and 127 to each other.

The first inductor electrode 110 and the via electrodes 120 and 121 define the first inductor. The second inductor electrode 111 and the via electrodes 122 and 123 define the second inductor. The third inductor electrode 112 and the via electrodes 124 and 125A define the third inductor. The fourth inductor electrode 113 and the via electrodes 126 and 127 define the fourth inductor. The fifth inductor electrode 114 and the via electrodes 128 and 129 define the fifth inductor.

The via coupling electrode 115 and the via electrode 125B define the sixth inductor. The via coupling electrode 116 and the via electrode 125C define the seventh inductor.

Next, first to fifth LC parallel resonators will be described in detail below.

A first capacitor electrode 130, a second capacitor electrode 131, a third capacitor electrode 132, a fourth capacitor electrode 133, and fifth capacitor electrode 134, which are individually included in LC parallel resonators, correspond to the first, second, third, fourth, and fifth inductor electrodes, respectively. The first capacitor electrode 130, the second capacitor electrode 131, the third capacitor electrode 132, the fourth capacitor electrode 133, and the fifth capacitor electrode 134 face the ground electrode, thereby defining first, second, third, fourth, and fifth capacitors, respectively.

The first LC parallel resonator is defined by the first inductor and the first capacitor. The second LC parallel resonator is defined by the second inductor and the second capacitor. The third LC parallel resonator is defined by the third inductor and the third capacitor. The fourth LC parallel resonator is defined by the fourth inductor and the fourth capacitor. The fifth LC parallel resonator is defined by the fifth inductor and the fifth capacitor. As in the third preferred embodiment, each of the first to fifth inductors has a center axis perpendicular to the lamination direction of the multilayer bandpass filter 100, and has a loop extending from a connection point (starting point) between one of via electrodes included in the inductor and a capacitor electrode to a connection point (endpoint) between the other one of the via electrodes and the ground electrode or a via coupling electrode. Accordingly, the relationship among each LC parallel resonator, an inductor electrode, a capacitor electrode, and a via electrode is as illustrated in table 2.

TABLE 2

| LC Parallel Resonator | Via Electrode | Capacitor Electrode | Inductor Electrode | Loop Direction |
|---|---|---|---|---|
| First | 120, 121 | 130 | 110 | 1 |
| Second | 122, 123 | 131 | 111 | 0 |
| Third | 124, 125A | 132 | 112 | 0 |
| Fourth | 126, 127 | 133 | 113 | 0 |
| Fifth | 128, 129 | 134 | 114 | 1 |

The definition of a loop direction in Table 2 is the same as that described in the third preferred embodiment. That is, the loop direction is a rotation direction of a loop formed by an inductor extending from its starting point as viewed from one direction in which LC parallel resonators are arranged.

The second and third inductors are electrically connected to each other by the via coupling electrode 115, and the third and fourth inductors are electrically connected to each other by the via coupling electrode 116. As a result, the second and third LC resonators are coupled to each other, and the third and fourth LC resonators are coupled to each other.

FIG. 8 is an equivalent circuit diagram of the multilayer bandpass filter 100 illustrated in FIG. 7. In FIG. 8, capacitors C23, C24, C25, C26, and C27 correspond to the first, second, third, fourth, and fifth capacitors, respectively, and inductors L23, L24, L25, L26, L27, L28, and L29 correspond to the first, second, third, fourth, fifth, sixth and seventh inductors, respectively. According to the fourth preferred embodiment, the effects and advantages of the first to third preferred embodiments can be obtained. In addition, since LC parallel resonators are coupled by a plurality of via coupling electrodes, it is possible to separately adjust an input-side impedance and an output-side impedance in the multilayer bandpass filter 100. It is possible to adjust the inductance ratio between the inductors L28 and L29 illustrated in FIG. 8 by changing the positions or thicknesses of the dielectric layers 102 and 103. As a result, the ratio between the input-side impedance and the output-side impedance can be freely determined. Thus, by disposing a plurality of via coupling electrodes, the design flexibility of the impedance value of the multilayer bandpass filter 100 is further improved.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multilayer bandpass filter comprising:
   a plurality of dielectric layers;
   a ground electrode;
   a plurality of LC parallel resonator circuits, each including:
      a capacitor electrode;
      an inductor electrode; and
      first and second via electrodes each passing through corresponding ones of the plurality of dielectric layers; wherein
      the capacitor electrode faces the ground electrode to define a capacitor;
      the inductor electrode includes one end portion that is connected to the capacitor electrode by the first via electrode and another end portion that is connected to the ground electrode by the second via electrode, and the first and second via electrodes and the inductor electrode define an inductor;
   a via coupling electrode arranged to directly connect only one of the first and second via electrodes in the inductor in one of the plurality of LC parallel resonator circuits and one of the first and second via electrodes in the inductor in another one of the plurality of LC parallel resonator circuits which is adjacent to the one of the plurality of LC parallel resonator circuits and does not directly connect any other ones of the first and second via electrodes in the inductor of any other of the plurality of LC parallel resonator circuits.

2. The multilayer bandpass filter according to claim 1, wherein, when the inductor in each of the plurality of LC parallel resonator circuits is defined as a loop extending from the capacitor electrode to the ground electrode via the inductor electrode, the plurality of LC parallel resonator circuits are arranged so that the loops of the plurality of LC parallel resonator circuits partially overlap, and directions of the loops of the adjacent ones of the plurality of LC parallel resonator circuits are set to the same direction when the loops are viewed from one direction in which the plurality of LC parallel resonator circuits are arranged.

3. The multilayer bandpass filter according to claim 1, wherein a common via electrode is arranged to connect the first and second via electrodes connected by the via coupling electrode from the via coupling electrode to the ground electrode.

4. The multilayer bandpass filter according to claim 1, wherein a plurality of the via coupling electrodes are provided, each of the plurality of via coupling electrodes being arranged to directly connect one of the first and second via electrodes in the inductor in one of the plurality of LC parallel resonator circuits and one of the first and second via electrodes in the inductor in another one of the plurality of LC parallel resonator circuits which is adjacent to the one of the plurality of LC parallel resonator circuits.

* * * * *